US008062422B2

(12) United States Patent
Chen et al.

(10) Patent No.: US 8,062,422 B2
(45) Date of Patent: *Nov. 22, 2011

(54) METHOD AND APPARATUS FOR GENERATING A PRECURSOR FOR A SEMICONDUCTOR PROCESSING SYSTEM

(75) Inventors: Ling Chen, Sunnyvale, CA (US); Vincent W. Ku, Palo Alto, CA (US); Hua Chung, San Jose, CA (US); Christophe Marcadal, Sunnyvale, CA (US); Seshadri Ganguli, Sunnyvale, CA (US); Jenny Lin, Saratoga, CA (US); Dien-Yeh Wu, San Jose, CA (US); Alan Ouye, San Mateo, CA (US); Mei Chang, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 311 days.

This patent is subject to a terminal disclaimer.

(21) Appl. No.: 12/371,138

(22) Filed: Feb. 13, 2009

(65) Prior Publication Data
US 2009/0151633 A1 Jun. 18, 2009

Related U.S. Application Data

(63) Continuation of application No. PCT/US2004/016715, filed on May 27, 2004, and a continuation-in-part of application No. 10/447,255, filed on May 27, 2003, now Pat. No. 6,905,541, which is a continuation-in-part of application No. 10/198,727, filed on Jul. 17, 2002, now Pat. No. 7,186,385.

(60) Provisional application No. 60/477,478, filed on Jun. 5, 2003.

(51) Int. Cl.
*C30B 25/02* (2006.01)

(52) U.S. Cl. .......... 117/201; 117/200; 117/202; 117/68; 117/105

(58) Field of Classification Search .................. 117/201, 117/202, 200, 68, 105
See application file for complete search history.

(56) References Cited

U.S. PATENT DOCUMENTS 6,077,396 A 6/2000 LaRiviere
(Continued)

FOREIGN PATENT DOCUMENTS

JP 2000351784 A 12/2000
(Continued)

OTHER PUBLICATIONS

Shenai, Deo V., et al., "Correlation of Vapor Pressure Equation and Film Properties with Trimethylindium Purity for the MOVPE Grown III-V Compounds," *Journal of Crystal Growth*, Feb. 2003, pp. 91-98, vol. 248, North-Holland Publishing Co., Amsterdam, NL.

(Continued)

*Primary Examiner* — Bob M Kunemund
(74) *Attorney, Agent, or Firm* — Patterson & Sheridan, L.L.P.

(57) ABSTRACT

Embodiments described herein are directed to an apparatus for generating a precursor for a semiconductor processing system. In one embodiment, an apparatus for generating a precursor gas during a vapor deposition process is described. The apparatus includes a canister containing an interior volume between a lid and a bottom, a gaseous inlet and a gaseous outlet disposed on the lid, a plurality of silos coupled to the bottom and extending from a lower region to an upper region of the interior volume, and a tantalum precursor having a chlorine concentration of about 5 ppm or less contained within the lower region of the canister.

20 Claims, 10 Drawing Sheets

U.S. PATENT DOCUMENTS

| | | |
|---|---|---|
| 6,718,126 B2 | 4/2004 | Lei |
| 6,730,267 B2 | 5/2004 | Stringer et al. |
| 6,866,951 B2 | 3/2005 | Foley et al. |
| 6,905,541 B2 | 6/2005 | Chen et al. |
| 7,186,385 B2 | 3/2007 | Ganguli et al. |
| 7,270,709 B2 | 9/2007 | Chen et al. |
| 7,429,361 B2 | 9/2008 | Ganguli et al. |
| 7,524,374 B2 * | 4/2009 | Chen et al. ............ 117/200 |
| 2002/0009544 A1 | 1/2002 | McFeely et al. |
| 2003/0082307 A1 | 5/2003 | Chung et al. |

FOREIGN PATENT DOCUMENTS

| | | |
|---|---|---|
| JP | 2001049434 A | 2/2001 |
| JP | 2002308894 A | 10/2002 |
| JP | 2002-359238 A | 12/2002 |
| WO | WO-03028090 A2 | 4/2003 |

OTHER PUBLICATIONS

International Search Report and Written Opinion issued Nov. 2, 2004 in PCT/US2004/016715.

Final Notice of Rejection for Application No. 2006-533450, dated Jul. 1, 2011.

Japanese Office Action for Application No. 2006-533450, dated Mar. 3, 2011.

* cited by examiner

METHOD AND APPARATUS FOR GENERATING A PRECURSOR FOR A SEMICONDUCTOR PROCESSING SYSTEM

CROSS-REFERENCE TO RELATED APPLICATIONS

This application is a continuation of International Application No. PCT/US04/16715, filed May 27, 2004, which claims priority to U.S. Provisional Patent Application Ser. No. 60/477,478, filed Jun. 5, 2003. The International Application is also a continuation-in-part of U.S. patent application Ser. No. 10/447,255, filed May 27, 2003, which issued as U.S. Pat. No. 6,905,541 on Jun. 14, 2005, which is a continuation-in-part of U.S. patent application Ser. No. 10/198,727 filed on Jul. 17, 2002, which issued as U.S. Pat. No. 7,186,385 on Mar. 6, 2007. All of the aforementioned patent applications are incorporated by reference herein.

BACKGROUND OF THE INVENTION

1. Field of the Invention

The present invention generally relates to depositing a barrier layer on a semiconductor substrate.

2. Description of the Related Art

Reliably producing sub-micron and smaller features is one of the key technologies for the next generation of very large scale integration (VLSI) and ultra large scale integration (ULSI) of semiconductor devices. However, as the fringes of circuit technology are pressed, the shrinking dimensions of interconnects in VLSI and ULSI technology have placed additional demands on the processing capabilities. The multilevel interconnects that lie at the heart of this technology require precise processing of high aspect ratio features, such as vias and other interconnects. Reliable formation of these interconnects is very important to VLSI and ULSI success and to the continued effort to increase circuit density and quality of individual substrates.

As circuit densities increase, the widths of vias, contacts and other features, as well as the dielectric materials between them, decrease to sub-micron dimensions (e.g., less than about 0.20 micrometers or less), whereas the thickness of the dielectric layers remains substantially constant, with the result that the aspect ratios for the features, i.e., their height divided by width, increase. Many traditional deposition processes have difficulty filling sub-micron structures where the aspect ratio exceeds 4:1, and particularly where the aspect ratio exceeds 10:1. Therefore, there is a great amount of ongoing effort being directed at the formation of substantially void-free and seam-free sub-micron features having high aspect ratios.

Currently, copper and its alloys have become the metals of choice for sub-micron interconnect technology because copper has a lower resistivity than aluminum, (about 1.7 μΩ-cm compared to about 3.1 μΩ-cm for aluminum), and a higher current carrying capacity and significantly higher electromigration resistance. These characteristics are important for supporting the higher current densities experienced at high levels of integration and increased device speed. Further, copper has a good thermal conductivity and is available in a highly pure state.

Copper metallization can be achieved by a variety of techniques. A typical method generally includes physical vapor depositing a barrier layer over a feature, physical vapor depositing a copper seed layer over the barrier layer, and then electroplating a copper conductive material layer over the copper seed layer to fill the feature. Finally, the deposited layers and the dielectric layers are planarized, such as by chemical mechanical polishing (CMP), to define a conductive interconnect feature.

However, one problem with the use of copper is that copper diffuses into silicon, silicon dioxide, and other dielectric materials which may compromise the integrity of devices. Therefore, conformal barrier layers become increasingly important to prevent copper diffusion. Tantalum nitride has been used as a barrier material to prevent the diffusion of copper into underlying layers. However, the chemicals used in the barrier layer deposition, such as pentakis(dimethylamido) tantalum (PDMAT; $Ta[NH_2(CH_3)_2]_5$), may include impurities that cause defects in the fabrication of semiconductor devises and reduce process yields. Therefore, there exists a need for a method of depositing a barrier layer from a high-purity precursor.

SUMMARY OF THE INVENTION

Embodiments of the present invention are directed to an apparatus for generating a precursor for a semiconductor processing system.

In one embodiment, an apparatus for generating a precursor gas during a vapor deposition process is described. The apparatus includes a canister containing an interior volume between a lid and a bottom, a gaseous inlet and a gaseous outlet disposed on the lid, a plurality of silos coupled to the bottom and extending from a lower region to an upper region of the interior volume, and a tantalum precursor having a chlorine concentration of about 5 ppm or less contained within the lower region of the canister.

In another embodiment, an apparatus for generating a precursor gas during a vapor deposition process is described. The apparatus includes a canister containing an interior volume between a lid and a bottom, a gaseous inlet and a gaseous outlet disposed on the lid, a plurality of silos coupled to the bottom and extending from a lower region to an upper region of the interior volume, a gas flow inlet tube coupled to the gaseous inlet and positioned to inject a carrier gas into the canister in a direction substantially away from the gaseous outlet, and a precursor material contained within the lower region of the canister.

In another embodiment, an apparatus for generating a precursor gas during a vapor deposition process is described. The apparatus includes a canister containing an interior volume between a lid and a bottom, at least three silos coupled to the bottom and extending from a lower region to an upper region of the interior volume, a gas flow inlet tube coupled to a gaseous inlet and positioned to inject a carrier gas into the canister in a direction substantially away from the gaseous outlet, and a precursor comprising pentakis(dimethylamido) tantalum contained within the lower region of the canister.

BRIEF DESCRIPTION OF THE DRAWINGS

So that the manner in which the above recited features of the present invention are attained and can be understood in detail, a more particular description of the invention, briefly summarized above, may be had by reference to the embodiments thereof, which are illustrated in the appended drawings. It is to be noted, however, that the appended drawings illustrate only typical embodiments of this invention, and are therefore, not to be considered limiting of its scope, for the invention may admit to other equally effective embodiments.

DETAILED DESCRIPTION OF THE PREFERRED EMBODIMENT

Figure 1:
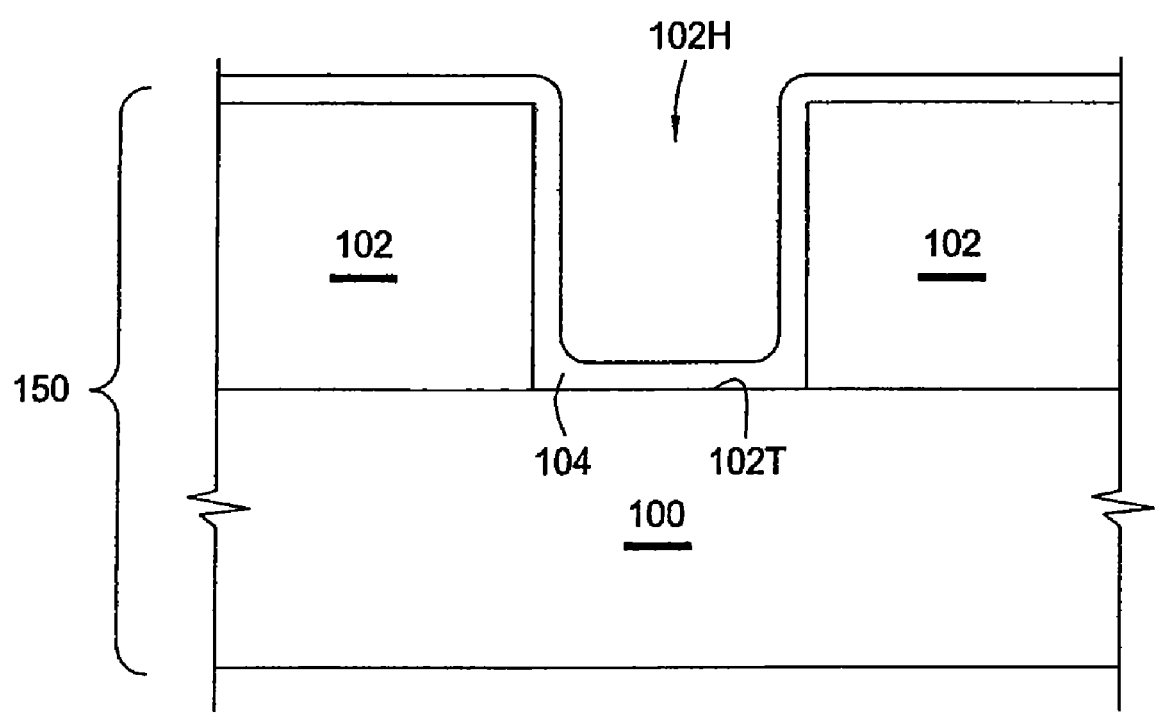
FIG. 1 is a schematic cross-sectional view of one embodiment of a barrier layer formed over a substrate by atomic layer deposition (ALD).

FIG. 1 is a schematic cross-sectional view of one embodiment of a substrate 100 having a dielectric layer 102 and a barrier layer 104 deposited thereon. Depending on the processing stage, the substrate 100 may be a silicon semiconductor substrate, or other material layer, which has been formed on the substrate. The dielectric layer 102 may be an oxide, a silicon oxide, carbon-silicon-oxide, a fluoro-silicon, a porous dielectric, or other suitable dielectric formed and patterned to provide a contact hole or via 102H extending to an exposed surface portion 102T of the substrate 100. For purposes of clarity, the substrate 100 refers to any work piece upon which film processing is performed, and a substrate structure 150 is used to denote the substrate 100 as well as other material layers formed on the substrate 100, such as the dielectric layer 102. It is also understood by those with skill in the art that the present invention may be used in a dual damascene process flow. The barrier layer 104 is formed over the substrate structure 150 of FIG. 1A by atomic layer deposition (ALD). Preferably, the barrier layer includes a tantalum nitride layer.

In one aspect, atomic layer deposition of a tantalum nitride barrier layer includes sequentially providing a tantalum containing compound and a nitrogen-containing compound to a process chamber. Sequentially providing a tantalum containing compound and a nitrogen-containing compound may result in the alternating chemisorption of monolayers of a tantalum-containing compound and of monolayers of a nitrogen-containing compound on the substrate structure 150.

Figure 2A:
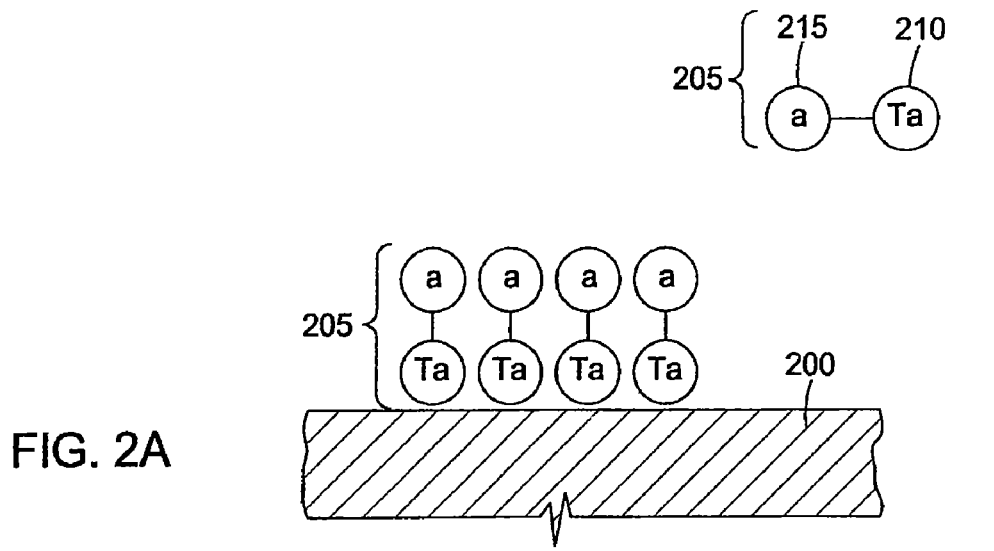
FIGS. 2A-2C illustrate one embodiment of the alternating chemisorption of monolayers of a tantalum containing compound and a nitrogen containing compound on an exemplary portion of substrate.
Figure 2B:
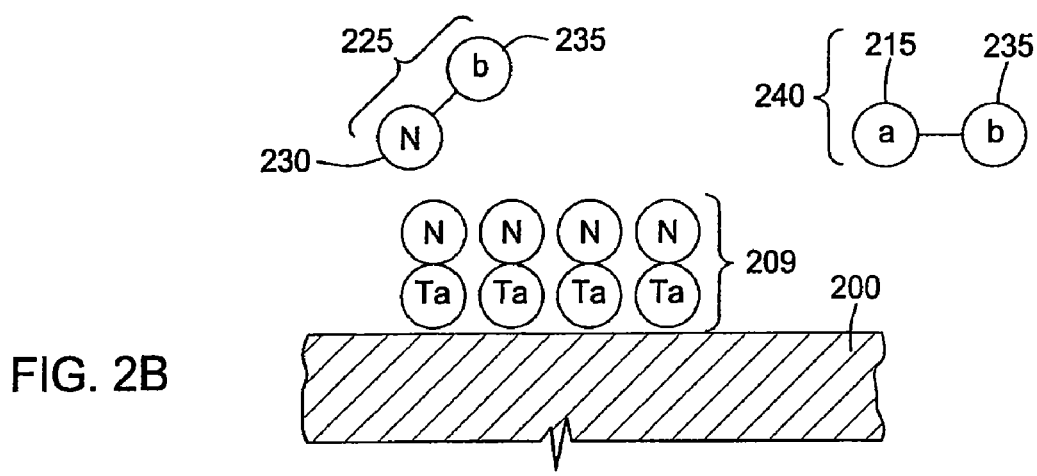
Figure 2C:
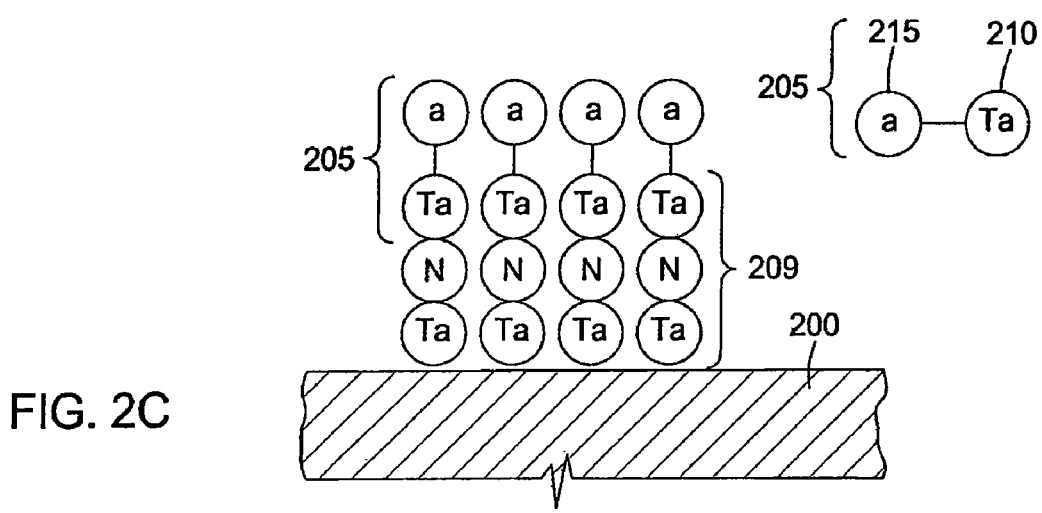

FIGS. 2A-2C illustrate one embodiment of the alternating chemisorption of monolayers of a tantalum containing compound and a nitrogen containing compound on an exemplary portion of substrate 200 in a stage of integrated circuit fabrication, and more particularly at a stage of barrier layer formation. In FIG. 2A, a monolayer of a tantalum containing compound is chemisorbed on the substrate 200 by introducing a pulse of the tantalum containing compound 205 into a process chamber.

The tantalum containing compound 205 typically includes tantalum atoms 210 with one or more reactive species 215. In one embodiment, the tantalum containing compound is pentadimethylamino-tantalum (PDMAT; $Ta(NMe_2)_5$). PDMAT may be used to advantage for a number of reasons. PDMAT is relatively stable. In addition, PDMAT has an adequate vapor pressure which makes it easy to deliver. In particular, PDMAT may be produced with a low halide content. The halide content of PDMAT should be produced with a halide content of less than 100 ppm. Not wishing to be bound by theory, it is believed that an organo-metallic precursor with a low halide content is beneficial because halides (such as chlorine) incorporated in the barrier layer may attack the copper layer deposited thereover.

Thermal decomposition of the PDMAT during production may cause impurities in the PDMAT product, which is subsequently used to form the tantalum nitride barrier layer. The impurities may include compounds such as $CH_3NTa(N(CH_3)_2)_3$ and $((CH_3)_2N)_3Ta(NCH_2CH_3)$. In addition, reactions with moisture may result in tantalum oxo amide compounds in the PDMAT product. Preferably, the tantalum oxo amide compounds are removed from the PDMAT by sublimation. For example, the tantalum oxo amide compounds are removed in a bubbler. The PDMAT product preferably has less than about 5 ppm of chlorine. In addition, the levels of lithium, iron, fluorine, bromine and iodine should be minimized. Most preferably, the total level of impurities is less than about 5 ppm.

The tantalum containing compound may be provided as a gas or may be provided with the aid of a carrier gas. Examples of carrier gases which may be used include, but are not limited to, helium (He), argon (Ar), nitrogen ($N_2$), and hydrogen ($H_2$).

After the monolayer of the tantalum containing compound is chemisorbed onto the substrate 200, excess tantalum containing compound is removed from the process chamber by introducing a pulse of a purge gas thereto. Examples of purge gases which may be used include, but are not limited to, helium (He), argon (Ar), nitrogen ($N_2$), hydrogen ($H_2$), and other gases.

Referring to FIG. 2B, after the process chamber has been purged, a pulse of a nitrogen containing compound 225 is introduced into the process chamber. The nitrogen containing compound 225 may be provided alone or may be provided with the aid of a carrier gas. The nitrogen containing compound 225 may comprise nitrogen atoms 230 with one or more reactive species 235. The nitrogen containing compound preferably includes ammonia gas ($NH_3$). Other nitrogen containing compounds may be used which include, but are not limited to, $N_xH_y$ with x and y being integers (e.g., hydrazine ($N_2H_4$)), dimethyl hydrazine (($CH_3$)$_2$N2H2), t-butylhydrazine ($C_4H_9N_2H_3$) phenylhydrazine ($C_6H_5N_2H_3$), other hydrazine derivatives, a nitrogen plasma source (e.g., $N_2$, $N_2/H_2$, $NH_3$, or a $N_2H_4$ plasma), 2,2'-azoisobutane (($CH_3$)$_6C_2N_2$), ethylazide ($C_2H_5N_3$), and other suitable gases. A carrier gas may be used to deliver the nitrogen containing compound if necessary.

A monolayer of the nitrogen containing compound 225 may be chemisorbed on the monolayer of the tantalum containing compound 205. The composition and structure of precursors on a surface during atomic-layer deposition (ALD) is not precisely known. Not wishing to be bound by theory, it is believed that the chemisorbed monolayer of the nitrogen containing compound 225 reacts with the monolayer of the tantalum containing compound 205 to form a tantalum nitride layer 209. The reactive species 215, 235 form by-products 240 that are transported from the substrate surface by the vacuum system.

After the monolayer of the nitrogen containing compound 225 is chemisorbed on the monolayer of the tantalum containing compound, any excess nitrogen containing compound is removed from the process chamber by introducing another pulse of the purge gas therein. Thereafter, as shown in FIG. 2C, the tantalum nitride layer deposition sequence of alternating chemisorption of monolayers of the tantalum containing compound and of the nitrogen containing compound may be repeated, if necessary, until a desired tantalum nitride thickness is achieved.

In FIGS. 2A-2C, the tantalum nitride layer formation is depicted as starting with the chemisorption of a monolayer of a tantalum containing compound on the substrate followed by a monolayer of a nitrogen containing compound. Alternatively, the tantalum nitride layer formation may start with the chemisorption of a monolayer of a nitrogen containing compound on the substrate followed by a monolayer of the tantalum containing compound. Furthermore, in an alternative embodiment, a pump evacuation alone between pulses of reactant gases may be used to prevent mixing of the reactant gases.

The time duration for each pulse of the tantalum containing compound, the nitrogen containing compound, and the purge gas is variable and depends on the volume capacity of a deposition chamber employed as well as a vacuum system coupled thereto. For example, (1) a lower chamber pressure of a gas will require a longer pulse time; (2) a lower gas flow rate will require a longer time for chamber pressure to rise and stabilize requiring a longer pulse time; and (3) a large-volume chamber will take longer to fill and will take longer for chamber pressure to stabilize thus requiring a longer pulse time. Similarly, time between each pulse is also variable and depends on volume capacity of the process chamber as well as the vacuum system coupled thereto. In general, the time duration of a pulse of the tantalum containing compound or the nitrogen containing compound should be long enough for chemisorption of a monolayer of the compound. In general, the pulse time of the purge gas should be long enough to remove the reaction by-products and/or any residual materials remaining in the process chamber.

Generally, a pulse time of about 1.0 second or less for a tantalum containing compound and a pulse time of about 1.0 second or less for a nitrogen containing compound are typically sufficient to chemisorb alternating monolayers on a substrate. A pulse time of about 1.0 second or less for a purge gas is typically sufficient to remove reaction by-products as well as any residual materials remaining in the process chamber. Of course, a longer pulse time may be used to ensure chemisorption of the tantalum containing compound and the nitrogen containing compound and to ensure removal of the reaction by-products.

During atomic layer deposition, the substrate may be maintained approximately below a thermal decomposition temperature of a selected tantalum containing compound. An exemplary heater temperature range to be used with tantalum containing compounds identified herein is approximately between about 20° C. and about 500° C. at a chamber pressure less than about 100 torr, preferably less than 50 torr. When the tantalum containing gas is PDMAT, the heater temperature is preferably between about 100° C. and about 300° C., more preferably between about 175° C. and 250° C. In other embodiments, it should be understood that other temperatures may be used. For example, a temperature above a thermal decomposition temperature may be used. However, the temperature should be selected so that more than 50 percent of the deposition activity is by chemisorption processes. In another example, a temperature above a thermal decomposition temperature may be used in which the amount of decomposition during each precursor deposition is limited so that the growth mode will be similar to an atomic layer deposition growth mode.

One exemplary process of depositing a tantalum nitride layer by atomic layer deposition in a process chamber includes sequentially providing pentadimethylamino-tantalum (PDMAT) at a flow rate between about 100 sccm and about 1000 sccm, and preferably between about 200 sccm and 500 sccm, for a time period of about 1.0 second or less, providing ammonia at a flow rate between about 100 sccm and about 1000 sccm, preferably between about 200 sccm and 500 sccm, for a time period of about 1.0 second or less, and a purge gas at a flow rate between about 100 sccm and about 1000 sccm, preferably between about 200 sccm and 500 sccm for a time period of about 1.0 second or less. The heater temperature preferably is maintained between about 100° C. and about 300° C. at a chamber pressure between about 1.0 and about 5.0 torr. This process provides a tantalum nitride layer in a thickness between about 0.5 Å and about 1.0 Å per cycle. The alternating sequence may be repeated until a desired thickness is achieved.

Figure 3:
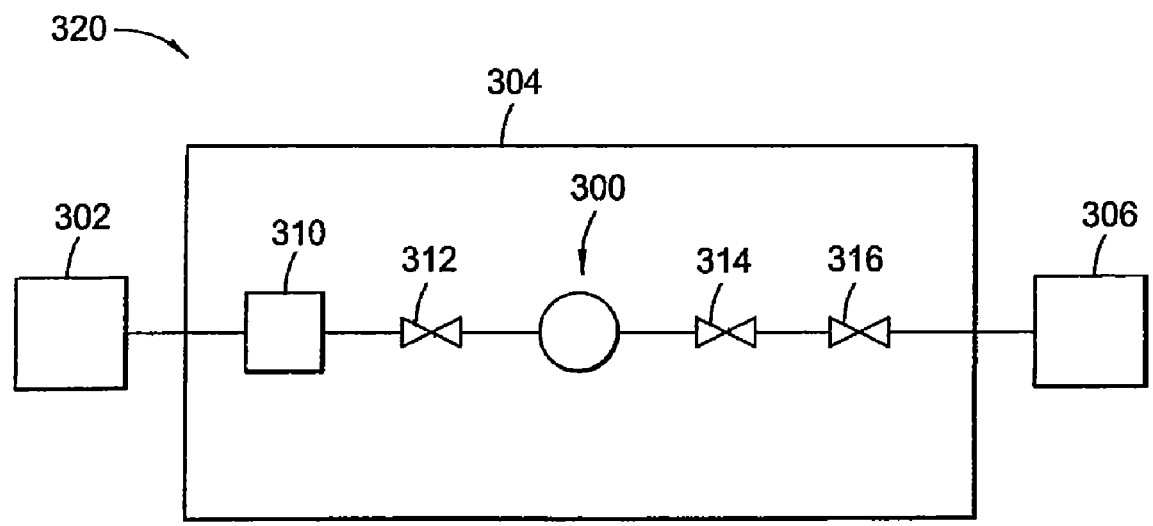
FIG. 3 is a schematic cross-sectional view of one exemplary embodiment of a processing system that may be used to form one or more barrier layers by atomic layer deposition.

FIG. 3 is a schematic cross-sectional view of one exemplary embodiment of a processing system 320 that may be used to form one or more barrier layers by atomic layer deposition in accordance with aspects of the present invention. Of course, other processing systems may also be used.

The processing system 320 generally includes a processing chamber 306 coupled to a gas delivery system 304. The processing chamber 306 may be any suitable processing chamber, for example, those available from Applied Materials, Inc. located in Santa Clara, Calif. Exemplary processing chambers include DPS CENTURA® etch chambers, PRODUCER® chemical vapor deposition chambers, and ENDURA® physical vapor deposition chambers, among others.

The gas delivery system 304 generally controls the rate and pressure at which various process and inert gases are delivered to the processing chamber 306. The number and types of process and other gases delivered to the processing chamber 306 are generally selected based on the process to be performed in the processing chamber 306 coupled thereto. Although for simplicity a single gas delivery circuit is depicted in the gas delivery system 304 shown in FIG. 3, it is contemplated that additional gas delivery circuits may be utilized.

The gas delivery system 304 is generally coupled between a carrier gas source 302 and the processing chamber 306. The carrier gas source 302 may be a local or remote vessel or a centralized facility source that supplies the carrier gas throughout the facility. The carrier gas source 302 typically supplies a carrier gas such as argon, nitrogen, helium or other inert or non-reactive gas.

The gas delivery system 304 typically includes a flow controller 310 coupled between the carrier gas source 302 and a process gas source canister 300. The flow controller 310 may be a proportional valve, modulating valve, needle valve, regulator, mass flow controller or the like. One flow controller 310 that may be utilized is available from Sierra Instruments, Inc., located in Monterey, Calif.

The source canister 300 is typically coupled to and located between a first and a second valve 312, 314. In one embodiment, the first and second valves 312, 314 are coupled to the source canister 300 and fitted with disconnect fittings (not shown) to facilitate removal of the valves 312, 314 with the source canister 300 from the gas delivery system 304. A third valve 316 is disposed between the second valve 314 and the processing chamber 306 to prevent introduction of contaminates into the processing chamber 306 after removal of the source canister 300 from the gas delivery system 304.

Figure 4B:
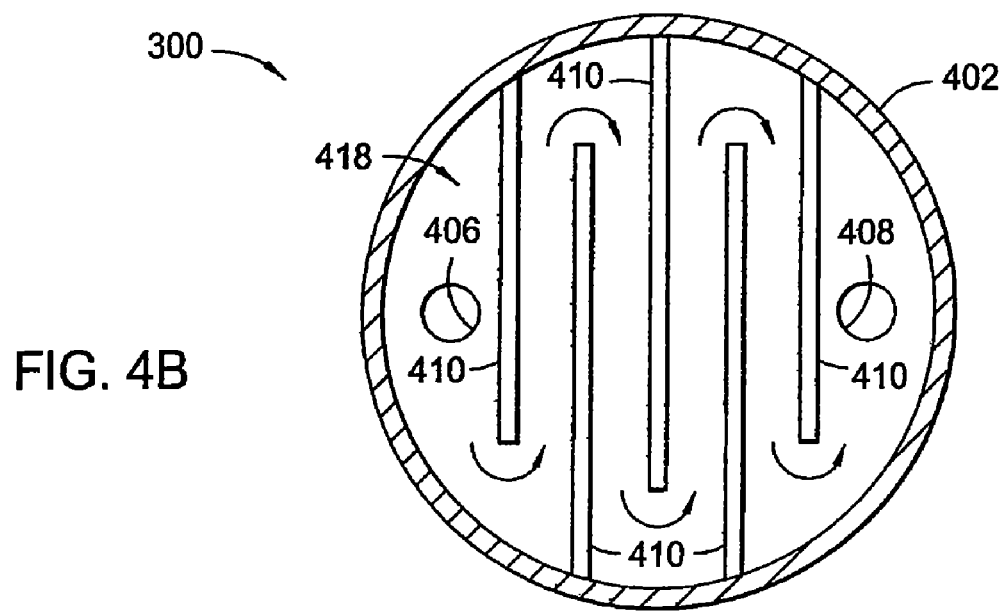
FIG. 4B is a sectional top view of the gas generation canister of FIG. 4A.
Figure 4A:
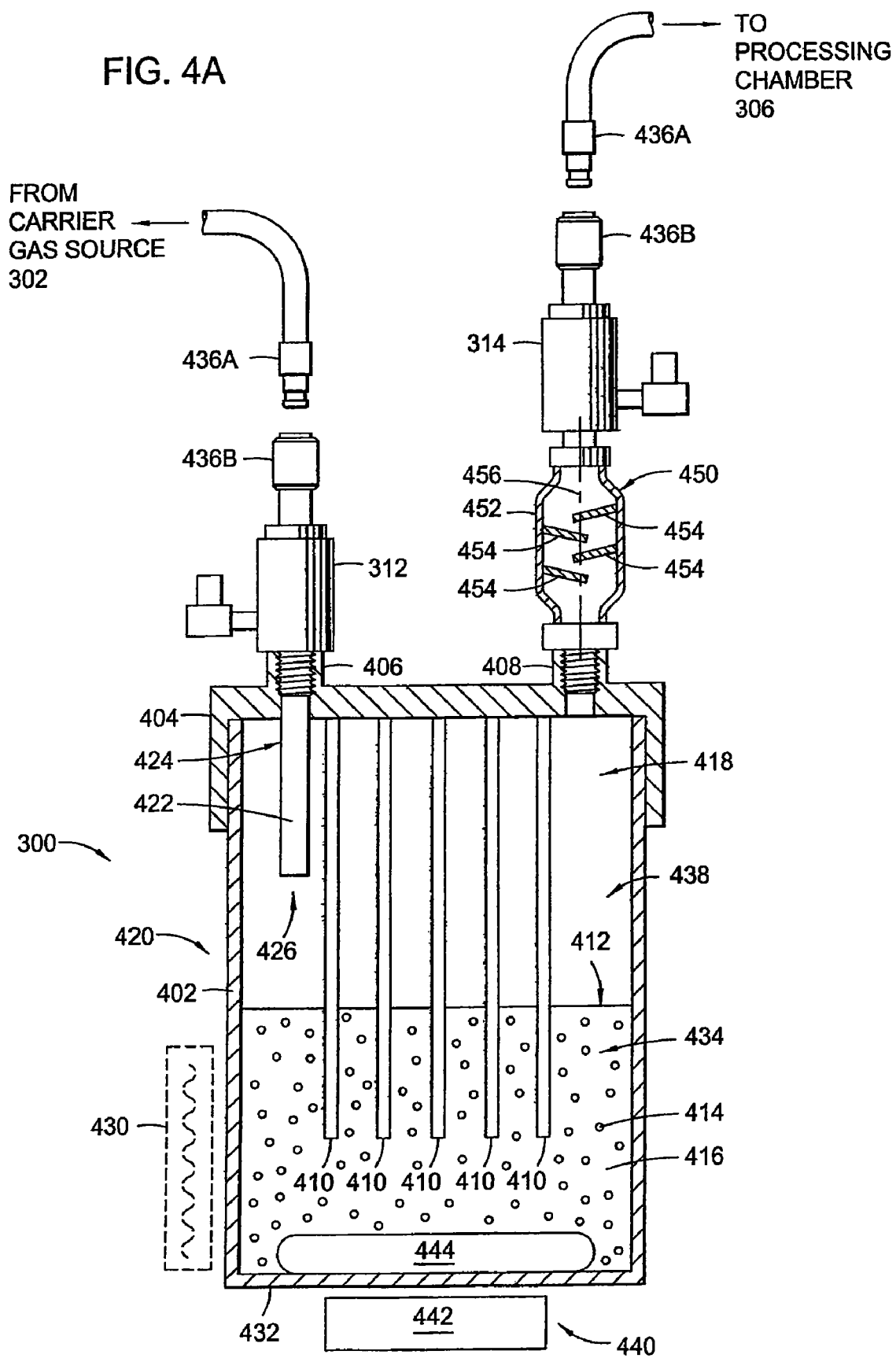
FIG. 4A is a sectional side view of one embodiment of a gas generation canister.

FIGS. 4A and 4B depict sectional views of one embodiment of the source canister 300. The source canister 300 generally comprises an ampoule or other sealed container having a housing 420 that is adapted to hold precursor materials 414 from which a process (or other) gas may be generated through a sublimation or vaporization process. Some solid precursor materials 414 that may generate a process gas in the source canister 300 through a sublimation process include xenon difluoride, nickel carbonyl, tungsten hexa-carbonyl, and pentakis (dimethylamino) tantalum (PDMAT), among others. Some liquid precursor-materials 414 that may generate a process gas in the source canister 300 through a vaporization process include tetrakis (dimethylamino) titanium (TDMAT), tertbutyliminotris (diethylamino) tantalum (TBTDET), and pentakis (ethylmethylamino) tantalum (PEMAT), among others. The housing 420 is generally fabricated from a material substantially inert to the precursor materials 414 and gas produced therefrom, and thus, the material of construction may vary based on gas being produced.

The housing 420 may have any number of geometric forms. In the embodiment depicted in FIGS. 4A and 4B, the housing 420 comprises a cylindrical sidewall 402 and a bottom 432 sealed by a lid 404. The lid 404 may be coupled to the sidewall 402 by welding, bonding, adhesives, or other leak-tight method. Alternately, the joint between the sidewall 402 and the lid 404 may have a seal, o-ring, gasket, or the like, disposed therebetween to prevent leakage from the source canister 300. The sidewall 402 may alternatively comprise other hollow geometric forms, for example, a hollow square tube.

An inlet port 406 and an outlet port 408 are formed through the source canister to allow gas flow into and out of the source canister 300. The ports 406, 408 may be formed through the lid 404 and/or sidewall 402 of the source canister 300. The ports 406, 408 are generally sealable to allow the interior of the source canister 300 to be isolated from the surrounding environment during removal of the source canister 300 from the gas delivery system 304. In one embodiment, valves 312, 314 are sealingly coupled to ports 406, 408 to prevent leakage from the source canister 300 when removed from the gas delivery system 304 (shown in FIG. 3) for recharging of the precursor material 414 or replacement of the source canister 300. Mating disconnect fittings 436A, 436B may be coupled to valves 312, 314 to facilitate removal and replacement of the source canister 300 to and from the gas delivery system 304. Valves 312, 314 are typically ball valves or other positive sealing valves that allows the source canister 300 to be removed from the system efficiently loaded and recycled while minimizing potential leakage from the source canister 300 during filling, transport, or coupling to the gas delivery system 304. Alternatively, the source canister 300 can be refilled through a refill port (not shown) such as a small tube with a VCR fitting disposed on the lid 404 of the source canister 300.

The source canister 300 has an interior volume 438 having an upper region 418 and a lower region 434. The lower region 434 of source canister 300 is at least partially filled with the precursor materials 414. Alternately, a liquid 416 may be added to a solid precursor material 414 to form a slurry 412. The precursor materials 414, the liquid 416, or the premixed slurry 412 may be introduced into source canister 300 by removing the lid 404 or through one of the ports 406, 408. The liquid 416 is selected such that the liquid 416 is non-reactive with the precursor materials 414, that the precursor materials 414 are insoluble therein, that the liquid 416 has a negligible vapor pressure compared to the precursor materials 414, and that the ratio of the vapor pressure of the solid precursor material 414, e.g., tungsten hexa-carbonyl, to that of the liquid 416 is greater than $10^3$.

Precursor materials 414 mixed with the liquid 416 may be sporadically agitated to keep the precursor materials 414 suspended in the liquid 416 in the slurry 412. In one embodiment, precursor materials 414 and the liquid 416 are agitated by a magnetic stirrer 440. The magnetic stirrer 440 includes a magnetic motor 442 disposed beneath the bottom 432 of the source canister 300 and a magnetic pill 444 disposed in the lower region 434 of the source canister 300. The magnetic motor 442 operates to rotate the magnetic pill 444 within the source canister 300, thereby mixing the slurry 412. The magnetic pill 444 should have an outer coating of material that is a non-reactive with the precursor materials 414, the liquid 416, or the source canister 300. Suitable magnetic mixers are commercially available. One example of a suitable magnetic mixer is IKAMAG® REO available from IKA® Works in Wilmington, N.C. Alternatively, the slurry 412 may be agitated other means, such as by a mixer, a bubbler, or the like.

The agitation of the liquid 416 may induce droplets of the liquid 416 to become entrained in the carrier gas and carried toward the processing chamber 306. To prevent such droplets of liquid 416 from reaching the processing chamber 306, an oil trap 450 may optionally be coupled to the exit port 408 of the source canister 300. The oil trap 450 includes a body 452 containing a plurality of interleaved baffles 454 which extend past a centerline 456 of the oil trap body 452 and are angled at least slightly downward towards the source canister 300. The baffles 454 force the gas flowing towards the processing chamber 306 to flow a tortuous path around the baffles 454. The surface area of the baffles 454 provides a large surface area exposed to the flowing gas to which oil droplets that may be entrained in the gas adhere. The downward angle of the baffles 454 allows any oil accumulated in the oil trap to flow downward and back into the source canister 300.

The source canister 300 includes at least one baffle 410 disposed within the upper region 418 of the source canister 300. The baffle 410 is disposed between inlet port 406 and outlet port 408, creating an extended mean flow path, thereby preventing direct (i.e., straight line) flow of the carrier gas from the inlet port 406 to the outlet port 408. This has the effect of increasing the mean dwell time of the carrier gas in the source canister 300 and increasing the quantity of sublimated or vaporized precursor gas carried by the carrier gas. Additionally, the baffles 410 direct the carrier gas over the entire exposed surface of the precursor material 414 disposed in the source canister 300, ensuring repeatable gas generation characteristics and efficient consumption of the precursor materials 414.

The number, spacing and shape of the baffles 410 may be selected to tune the source canister 300 for optimum generation of precursor gas. For example, a greater number of baffles 410 may be selected to impart higher carrier gas velocities at the precursor material 414 or the shape of the baffles 410 may be configured to control the consumption of the precursor material 414 for more efficient usage of the precursor material.

The baffle 410 may be attached to the sidewall 402 or the lid 404, or the baffle 410 may be a prefabricated insert designed to fit within the source canister 300. In one embodiment, the baffles 410 disposed in the source canister 300 comprise five rectangular plates fabricated of the same material as the sidewall 402. Referring to FIG. 4B, the baffles 410 are welded or otherwise fastened to the sidewall 402 parallel to each other. The baffles 410 are interleaved, fastened to opposing sides of the source canister in an alternating fashion, such that a serpentine extended mean flow path is created. Furthermore, the baffles 410 are situated between the inlet port 406 and the outlet port 408 on the lid 404 when placed on the sidewall 402 and are disposed such that there is no air space between the baffles 410 and the lid 404. The baffles 410 additionally extend at least partially into the lower region 434 of the source canister 300, thus defining an extended mean flow path for the carrier gas flowing through the upper region 418.

Optionally, an inlet tube 422 may be disposed in the interior volume 438 of the source canister 300. The tube 422 is coupled by a first end 424 to the inlet port 406 of the source canister 300 and terminates at a second end 426 in the upper region 418 of the source canister 300. The tube 422 injects the carrier gas into the upper region 418 of the source canister 300 at a location closer to the precursor materials 414 or the slurry 412.

The precursor materials 414 generate a precursor gas at a predefined temperature and pressure. Sublimating or vaporized gas from the precursor materials 414 accumulate in the upper region 418 of the source canister 300 and are swept out by an inert carrier gas entering through inlet port 406 and exiting outlet port 408 to be carried to the processing chamber 306. In one embodiment, the precursor materials 414 are heated to a predefined temperature by a resistive heater 430 disposed proximate to the sidewall 402. Alternately, the precursor materials 414 may be heated by other means, such as by a cartridge heater (not shown) disposed in the upper region 418 or the lower region 434 of the source canister 300 or by preheating the carrier gas with a heater (not shown) placed upstream of the carrier gas inlet port 406. To maximize uniform heat distribution throughout the slurry 412, the liquid 416 and the baffles 410 should be good conductors of heat.

Figure 8:
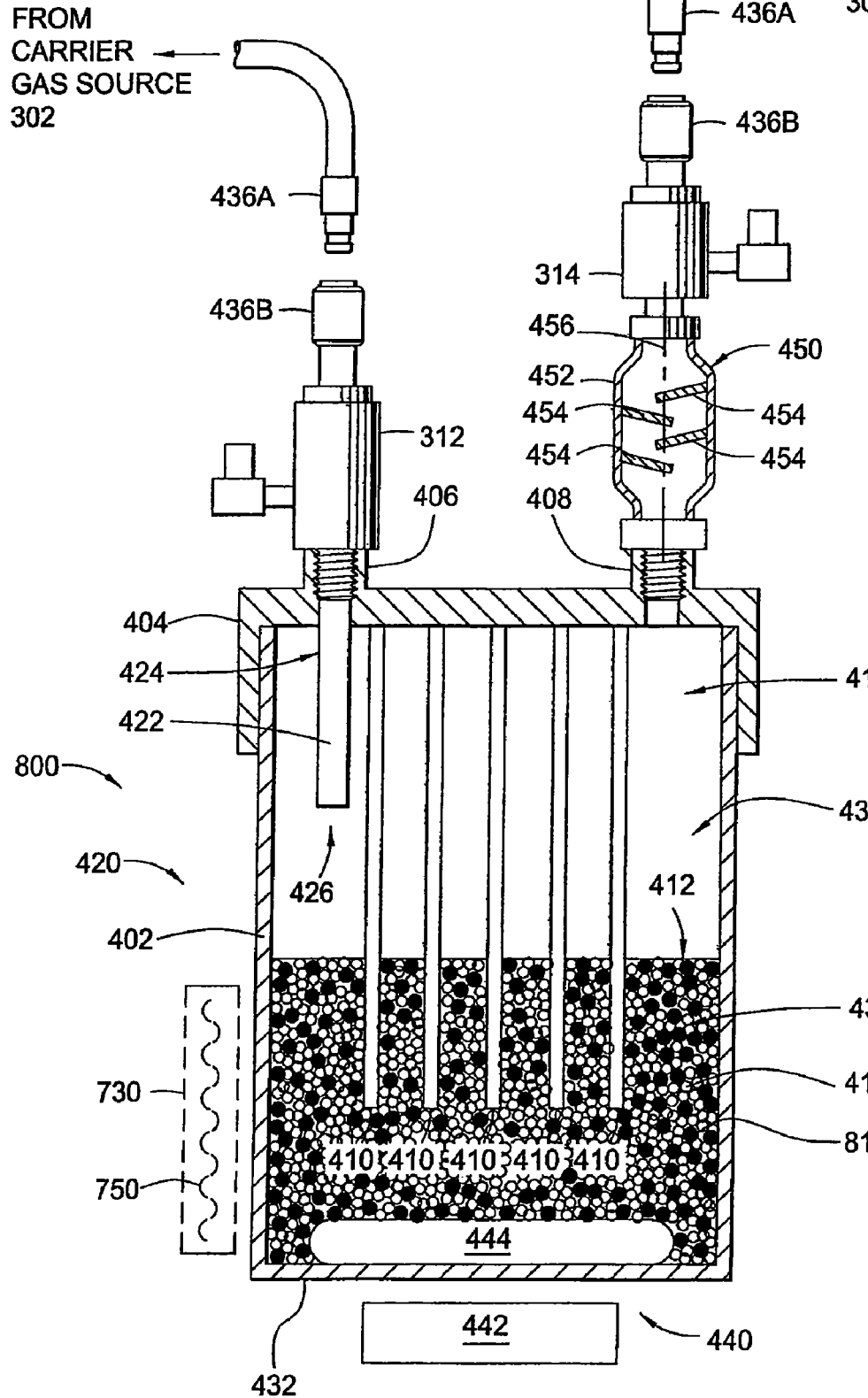
FIG. 8 illustrates a sectional view of a canister containing a plurality of solid particles in accordance with one embodiment of the invention.

In accordance with yet another embodiment of the invention, a plurality of solid beads or particles 810 with high thermal conductivity, such as, aluminum nitride or boron nitride, may be used in lieu of the liquid 416, as shown in FIG. 8. Such solid particles 810 may be used to transfer more heat from the sidewall of the canister 800 to the precursor materials 414 than the liquid 416. The solid particles 810 have the same properties as the liquid 416 in that they are non-reactive with the precursor materials 414, insoluble, have a negligible vapor pressure compared to the precursor materials 414. As such, the solid particles 810 are configured to efficiently transfer heat from the sidewall of the canister 800 to the center portion of the canister 800, thereby leading to more precursor material utilization during sublimation or vaporization. The solid particles 810 may also be degassed and cleaned from contaminants, water vapor and the like, prior to being deposited into the canister 800.

In one exemplary mode of operation, the lower region 434 of the source canister 300 is at least partially filled with a mixture of tungsten hexa-carbonyl and diffusion pump oil to form the slurry 412. The slurry 412 is held at a pressure of about Torr and is heated to a temperature in the range of about 40 degrees Celsius to about 50 degrees Celsius by a resistive heater 430 located proximate to the source canister 300. Carrier gas in the form of argon is flowed through inlet port 406 into the upper region 418 at a rate of about 400 standard cc/min. The argon flows in an extended mean flow path defined by the torturous path through the baffles 410 before exiting the source canister 300 through outlet port 408, advantageously increasing the mean dwell time of the argon in the upper region 418 of the source canister 300. The increased dwell time in the source canister 300 advantageously increases the saturation level of sublimated tungsten hexa-carbonyl vapors within the carrier gas. Moreover, the torturous path through the baffles 410 advantageously exposes the substantially all of the exposed surface area of the precursor material 414 to the carrier gas flow for uniform consumption of the precursor material 414 and generation of the precursor gas.

Figure 7:
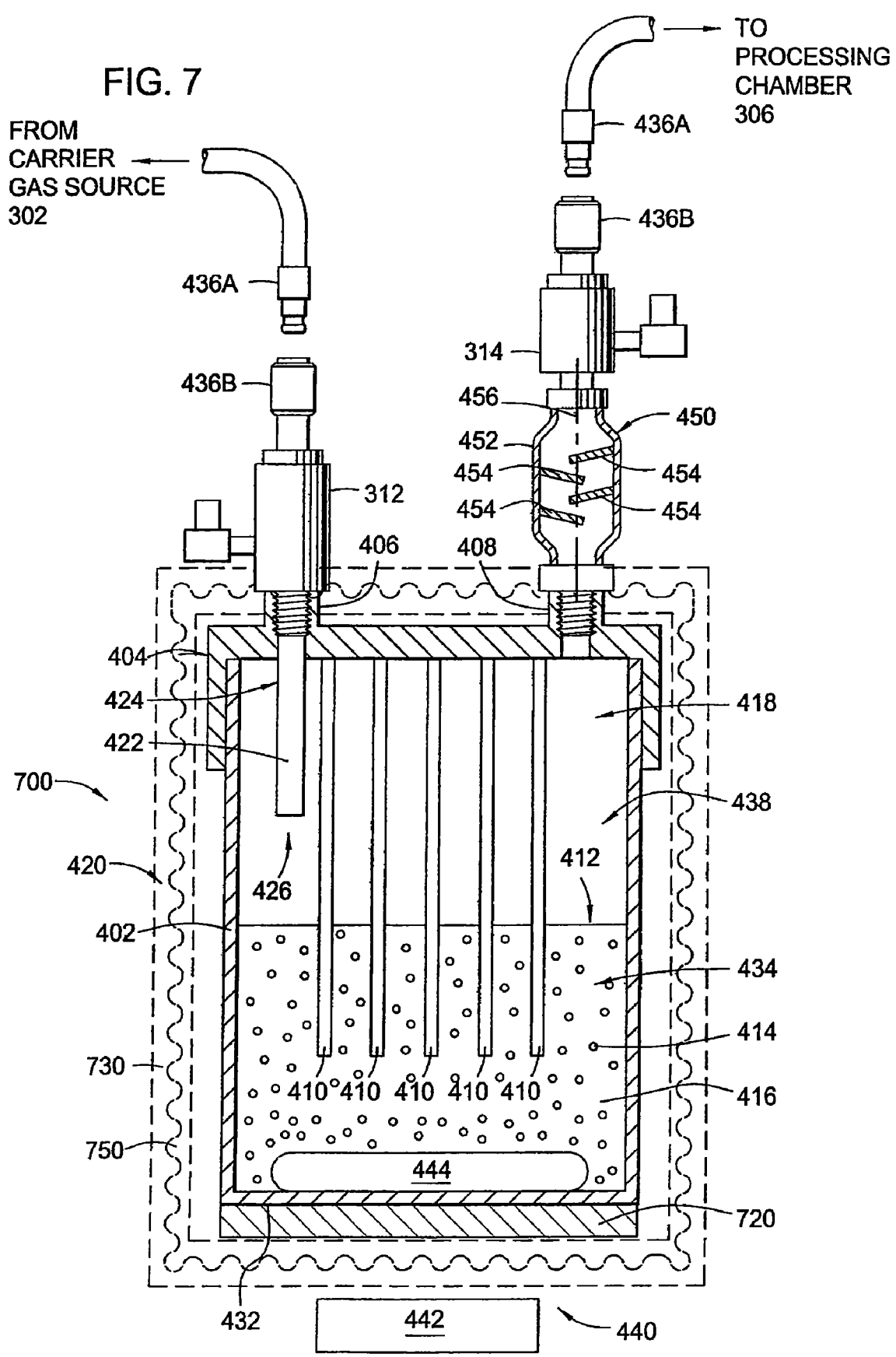
FIG. 7 illustrates a sectional view of a canister surrounded by a canister heater in accordance with one embodiment of the invention.

FIG. 7 illustrates another embodiment for heating the precursor materials 414. More specifically, FIG. 7 illustrates a sectional view of a canister 700 surrounded by a canister heater 730, which is configured to create a temperature gradient between a lower region 434 of the canister 700 and an upper region 418 of the canister 700 with the lower region 434 being the coldest region and the upper region 418 being the hottest region. The temperature gradient may range from about 5 degrees Celsius to about 15 degrees Celsius. Since solid precursor materials generally tend to accumulate or condense at the coldest region of the canister 700, the canister heater 730 is configured to ensure that the solid precursor materials 414 will accumulate at the lower region 434 of the canister 700, thereby increasing the predictability of where the solid precursor materials 414 will condense and the temperature of the solid precursor materials 414. The canister heater 730 includes a heating element 750 disposed inside the canister heater 730 such that the entire canister 700, including the upper region 418 and the lower region 434, is heated by the canister heater 730. The heating element 750 near the upper region 418 may be configured to generate more heat than the heating element 750 near the lower region 434, thereby allowing the canister heater 730 to create the temperature gradient between the lower region 434 and the upper region 418. In one embodiment, the heating element 750 is configured such that the temperature at the upper region 418 is between about 5 degrees to about 15 degrees Celsius higher than the temperature at the lower region 434. In another embodiment, the heating element 750 is configured such that the temperature at the upper region 418 is about 70 degrees Celsius, the temperature at the lower region 434 is about 60 degrees Celsius and the temperature at the sidewall of the canister 700 is about 65 degrees Celsius. The power of the heating element 730 may be about 600 Watts at 208 VAC input.

The canister heater 730 may also include a cooling plate 720 positioned at the bottom of the canister heater 730 to further ensure that the coldest region of the canister 700 is the lower region 434, and thereby ensuring that the solid precursor materials 414 condense at the lower region 434. The cooling plate 720 may also be annular in shape. Further, the valves 312, 314, the oil trap 450, the inlet port 406 and the exit port 408 may be heated with a resistive heating tape. Since the upper region 418 is configured to have a higher temperature than the lower region 434, the baffles 410 may be used to transfer heat from the upper region 418 to the lower region 434, thereby allowing the canister heater 730 to maintain the desired temperature gradient.

Figure 9:
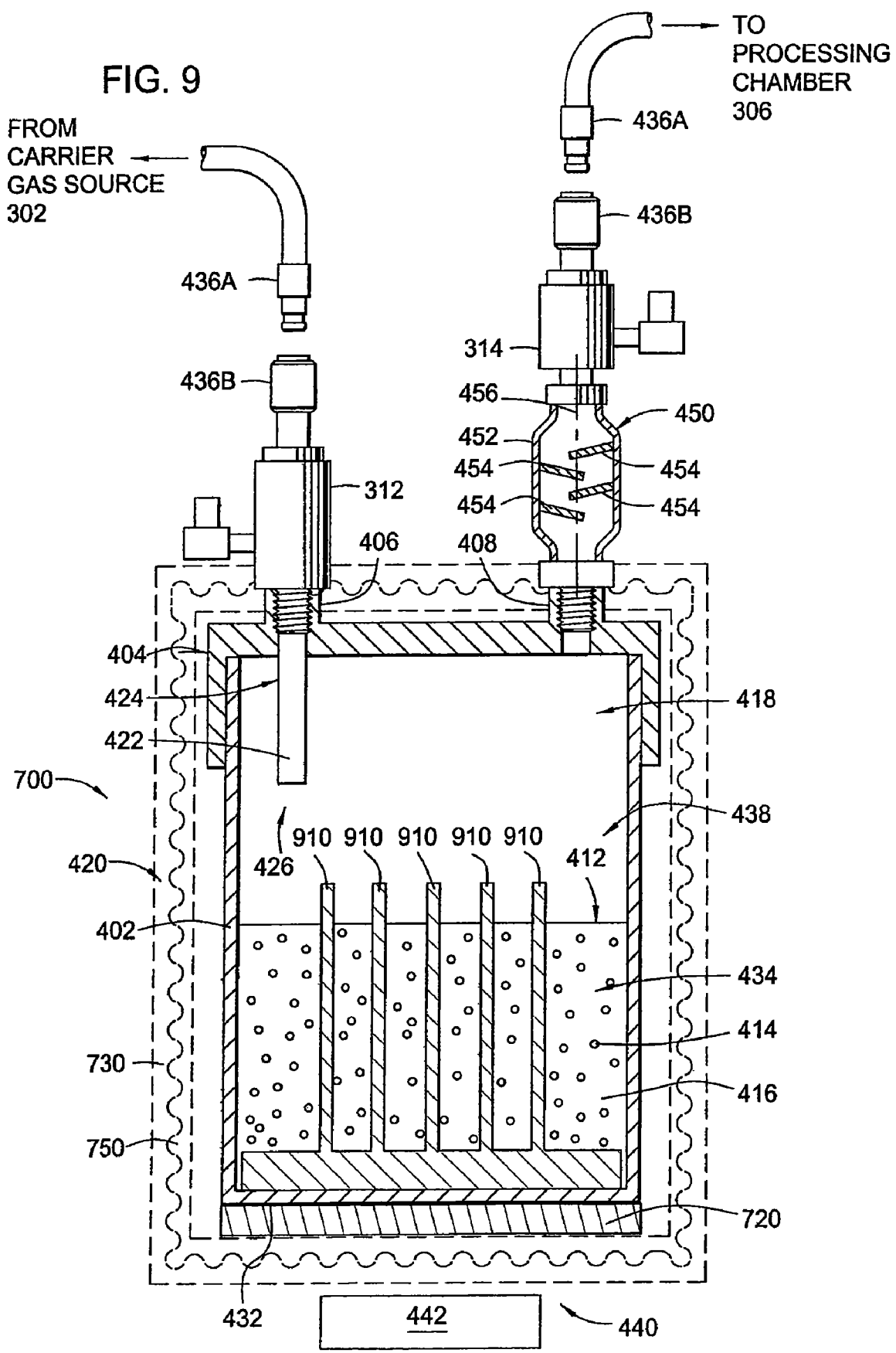
FIG. 9 illustrates a cross sectional view of a plurality of silos extending from the bottom portion of the canister to the upper region in accordance with one embodiment of the invention.
Figure 10:
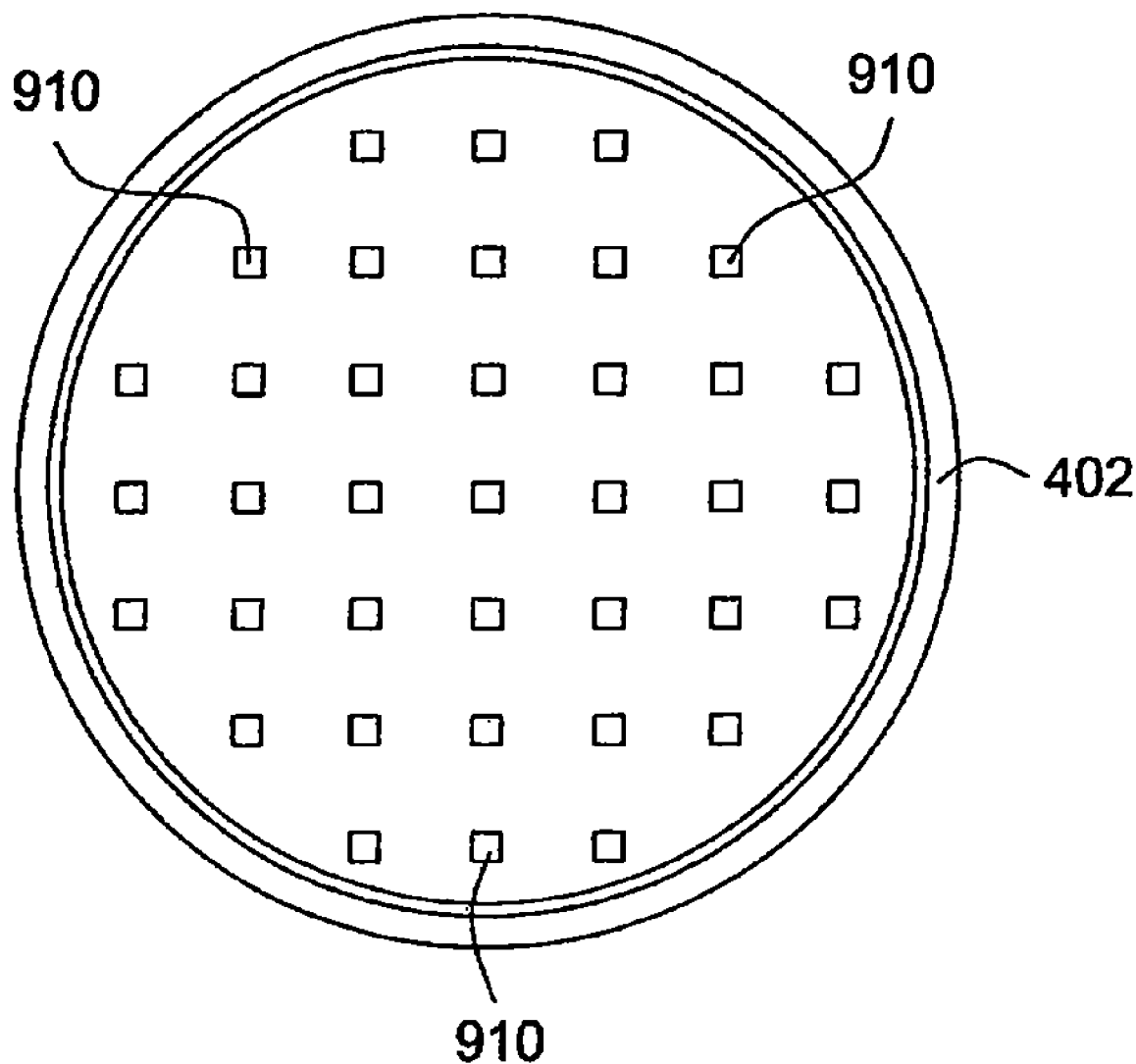
FIG. 10 illustrates a top view of a plurality of silos extending from the bottom portion of the canister to the upper region in accordance with one embodiment of the invention.

FIG. 9 illustrates a cross sectional view of a plurality of silos 910 extending from the bottom portion 432 of the canister 700 to the upper region 418. FIG. 10 illustrates a top view of the silos 910 extending from the bottom portion 432 of the canister 700 to the upper region 418. The silos 910 are configured to reduce the temperature gradient in the precursor materials 414, and thereby keeping the temperature inside the precursor materials 414 substantially uniform. The silos 910 may extend from the bottom portion 432 to slightly above the upper surface of the precursor materials 414 and the liquid 416. The silos 910 may be in the form of posts or fins. The silos 910 may be made from a heat-conducting material, such as, stainless steel, aluminum and the like.

FIG. 9 further illustrates an inlet tube 422 disposed in the interior volume 438 of the source canister 700. The tube 422 is coupled by a first end 424 to the inlet port 406 of the source canister 700 and terminates at a second end 426 in the upper region 418 of the source canister 700. The tube 422 injects the carrier gas into the upper region 418 of the source canister 700 at a location closer to the precursor materials 414 or the slurry 412. The second end 426 may further may be adapted to direct the flow of gas toward the sidewall 402, thus preventing direct (linear or line of sight) flow of the gas through the canister 700 between the ports 406, 408, creating an extended mean flow path.

Figure 5:
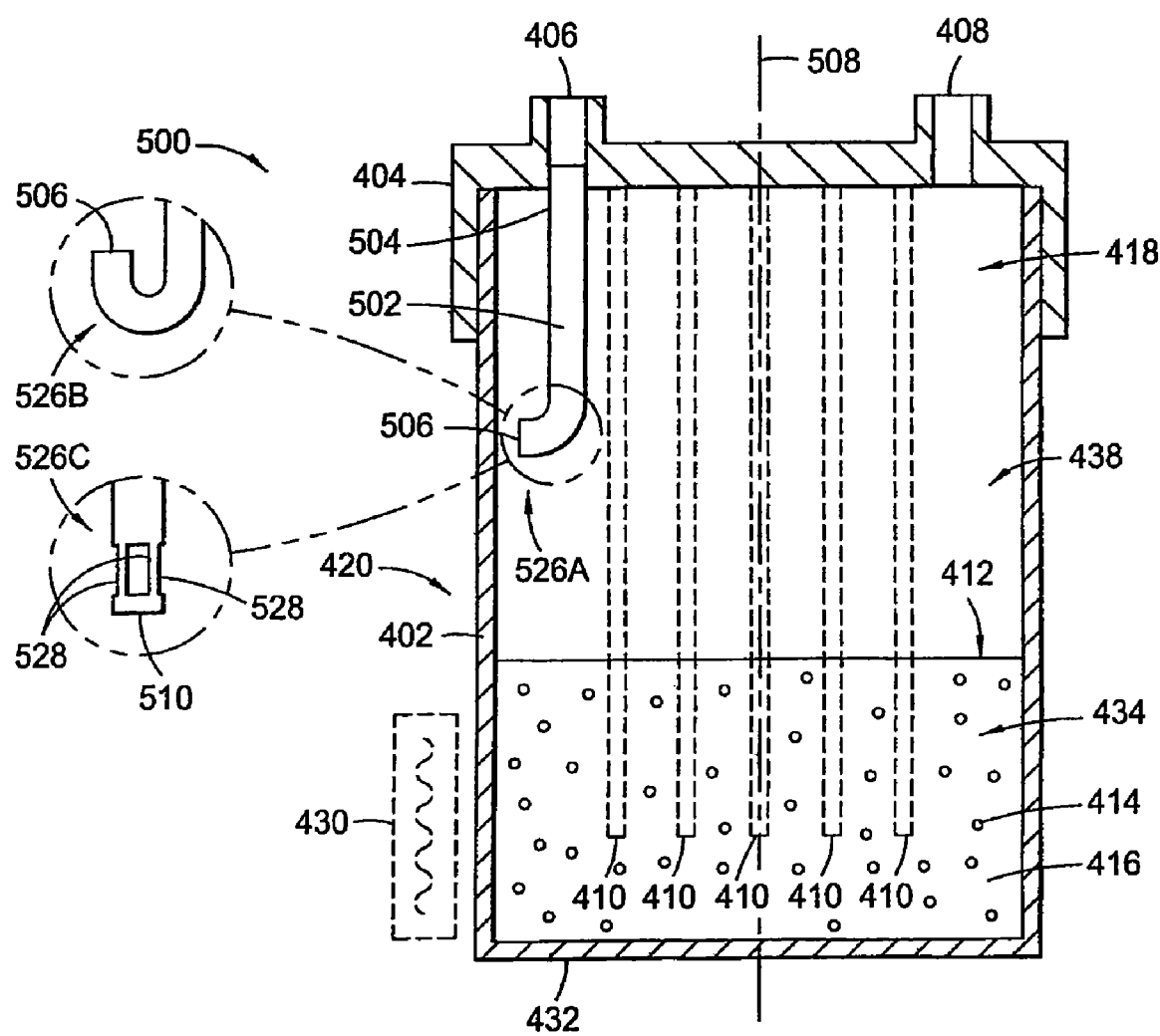
FIG. 5 is a sectional view of another embodiment of a gas generation canister.

FIG. 5 depicts a sectional view of another embodiment of a canister 500 for generating a process gas. The canister 500 includes a sidewall 402, a lid 404 and a bottom 432 enclosing an interior volume 438. At least one of the lid 404 or sidewall 402 contains an inlet port 406 and an outlet port 408 for gas entry and egress. The interior volume 438 of the canister 500 is split into an upper region 418 and a lower region 434. Precursor materials 414 at least partially fill the lower region 434. The precursor materials 414 may be in the form of a solid, liquid or slurry, and are adapted to generate a process gas by sublimation and/or vaporization.

A tube 502 is disposed in the interior volume 438 of the canister 500 and is adapted to direct a flow of gas within the canister 500 away from the precursor materials 414, advantageously preventing gas flowing out of the tube 502 from directly impinging the precursor materials 414 and causing particulates to become airborne and carried through the outlet port 408 and into the processing chamber 306. The tube 502 is coupled at a first end 504 to the inlet port 406. The tube 502 extends from the first end 504 to a second end 526A that is positioned in the upper region 418 above the precursor materials 414. The second end 526A may be adapted to direct the flow of gas toward the sidewall 402, thus preventing direct (linear or line of sight) flow of the gas through the canister 500 between the ports 406, 408, creating an extended mean flow path.

In one embodiment, an outlet 506 of the second end 526A of the tube 502 is oriented an angle of about 15 to about 90 degrees relative to a center axis 508 of the canister 500. In another embodiment, the tube 502 has a 'J'-shaped second end 526B that directs the flow of gas exiting the outlet 506 towards the lid 404 of the canister 500. In another embodiment, the tube 502 has a capped second end 526C having a plug or cap 510 closing the end of the tube 502. The capped second end 526C has at least one opening 528 formed in the side of the tube 502 proximate the cap 510. Gas, exiting the openings 528, is typically directed perpendicular to the center axis 508 and away from the precursor materials 414 disposed in the lower region 434 of the canister 500. Optionally, at least one baffle 410 (shown in phantom) as described above may be disposed within the chamber 500 and utilized in tandem with any of the embodiments of the tube 502 described above.

In one exemplary mode of operation, the lower region 434 of the canister 500 is at least partially filled with a mixture of tungsten hexa-carbonyl and diffusion pump oil to form the slurry 412. The slurry 412 is held at a pressure of about 5 Torr and is heated to a temperature in the range of about 40 to about 50 degrees Celsius by a resistive heater 430 located proximate to the canister 500. A carrier gas in the form of argon is flowed through the inlet port 406 and the tube 502 into the upper region 418 at a rate of about 200 standard cc/min. The second end 526A of the tube 502 directs the flow of the carrier gas in an extended mean flow path away from the outlet port 408, advantageously increasing the mean dwell time of the argon in the upper region 418 of the canister 500 and preventing direct flow of carrier gas upon the precursor materials 414 to minimize particulate generation. The increased dwell time in the canister 500 advantageously increases the saturation level of sublimated tungsten hexa-carbonyl gas within the carrier gas while the decrease in particulate generation improves product yields, conserves source solids, and reduces downstream contamination.

Figure 6:
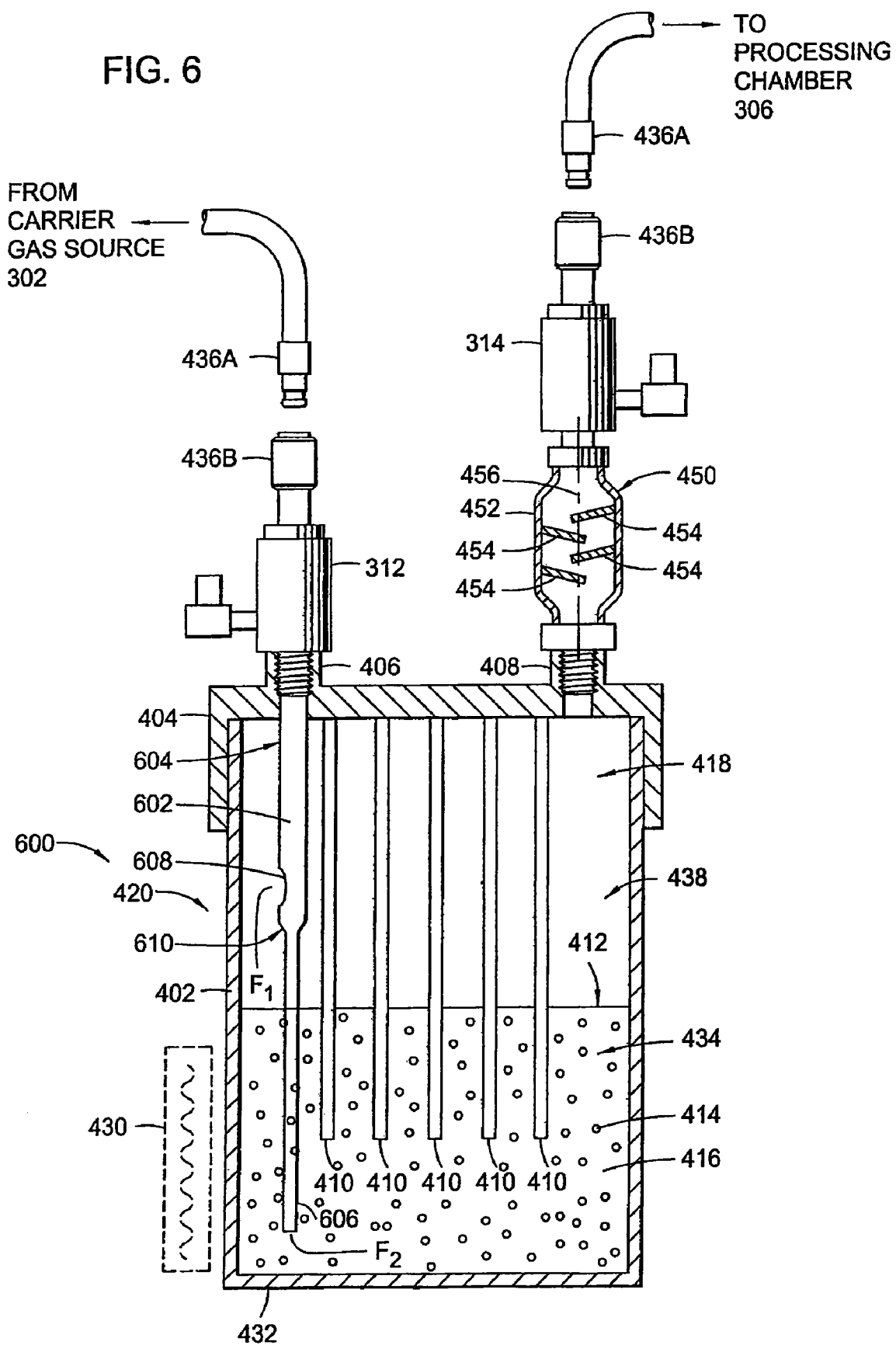
FIG. 6 is a sectional side view of another embodiment of a gas generation canister.

FIG. 6 depicts a sectional view of another embodiment of a canister 600 for generating a precursor gas. The canister 600 includes a sidewall 402, a lid 404 and a bottom 432 enclosing an interior volume 438. At least one of the lid 404 or sidewall 402 contains an inlet port 406 and an outlet port 408 for gas entry and egress. Inlet and outlet ports 406, 408 are coupled to valves 312, 314 fitted with mating disconnect fittings 436A, 436B to facilitate removal of the canister 600 from the gas delivery system 304. Optionally, an oil trap 450 is coupled between the outlet port 408 and the valve 314 to capture any oil particulate that may be present in the gas flowing to the process chamber 306.

The interior volume 438 of the canister 600 is split into an upper region 418 and a lower region 434. Precursor materials 414 and a liquid 416 at least partially fill the lower region 434. A tube 602 is disposed in the interior volume 438 of the canister 600 and is adapted to direct a first gas flow $F_1$ within the canister 600 away from the precursor material and liquid mixture and to direct a second gas flow $F_2$ through the mixture. The flow $F_1$ is much greater than the flow $F_2$. The flow $F_2$ is configured to act as a bubbler, being great enough to agitate the precursor material and liquid mixture but not enough to cause particles or droplets of the precursor materials 414 or liquid 416 from becoming airborne. Thus, this embodiment advantageously agitates the precursor material and liquid mixture while minimizing particulates produced due to direct impingement of the gas flowing out of the tube 602 on the precursor materials 414 from becoming airborne and carried through the outlet port 408 and into the processing chamber 306.

The tube 602 is coupled at a first end 604 to the inlet port 406. The tube 602 extends from the first end 604 to a second end 606 that is positioned in the lower region 434 of the canister 600, within the precursor material and liquid mixture. The tube 602 has an opening 608 disposed in the upper region 418 of the canister 600 that directs the first gas flow $F_1$ towards a sidewall 402 of the canister 600. The tube 600 has a restriction 610 disposed in the upper region 438 of the canister 600 located below the opening 608. The restriction 610 serves to decrease the second gas flow $F_2$ flowing toward the second end 606 of the tube 602 and into the slurry 412. By adjusting the amount of the restriction, the relative rates of the first and second gas flows $F_1$ and $F_2$ can be regulated. This regulation serves at least two purposes. First, the second gas flow $F_2$ can be minimized to provide just enough agitation to maintain suspension or mixing of the precursor materials 414 in the liquid 416 while minimizing particulate generation and potential contamination of the processing chamber 306. Second, the first gas flow $F_1$ can be regulated to maintain the overall flow volume necessary to provide the required quantity of sublimated and/or vapors from the precursor materials 414 to the processing chamber 306.

Optionally, an at least one baffle 410 as described above may be disposed within the canister 600 and utilized in tandem with any of the embodiments of the tube 602 described above.

While foregoing is directed to the preferred embodiment of the present invention, other and further embodiments of the invention may be devised without departing from the basic scope thereof, and the scope thereof is determined by the claims that follow.

What is claimed is:

1. An apparatus for generating a precursor gas during a vapor deposition process, comprising:
   a canister containing an interior volume between a lid and a bottom;
   a gaseous inlet and a gaseous outlet disposed on the lid;
   a plurality of silos coupled to the bottom and extending from a lower region to an upper region of the interior volume; and
   a tantalum precursor having a chlorine concentration of about 5 ppm or less contained within the lower region of the canister.

2. The apparatus of claim 1, wherein the tantalum precursor comprises pentakis(dimethylamido) tantalum.

3. The apparatus of claim 1, wherein the silos are fins or posts.

4. The apparatus of claim 1, wherein the plurality of silos comprise a thermal-conducting material.

5. The apparatus of claim 4, wherein the thermal-conducting material is selected from the group consisting of aluminum, stainless steel, and combinations thereof.

6. The apparatus of claim 5, wherein the plurality of silos comprises at least three silos.

7. The apparatus of claim 1, further comprising a gas flow inlet tube coupled to the gaseous inlet and extending from the upper region of the canister to the lower region of the canister.

8. The apparatus of claim 7, wherein an outlet tip of the gas flow inlet tube is positioned to direct gas flow away from the gaseous outlet.

9. An apparatus for generating a precursor gas during a vapor deposition process, comprising:
   a canister containing an interior volume between a lid and a bottom;
   a gaseous inlet and a gaseous outlet disposed on the lid;
   a plurality of silos coupled to the bottom and extending from a lower region to an upper region of the interior volume;
   a gas flow inlet tube coupled to the gaseous inlet and positioned to inject a carrier gas into the canister in a direction substantially away from the gaseous outlet; and
   a precursor material contained within the lower region of the canister.

10. The apparatus of claim 9, wherein the plurality of silos are fins or posts.

11. The apparatus of claim 9, wherein the silos comprise a thermal-conducting material.

12. The apparatus of claim 11, wherein the thermal-conducting material is selected from the group consisting of aluminum, stainless steel, and combinations thereof.

13. The apparatus of claim 12, wherein the plurality of silos comprises at least three silos.

14. The apparatus of claim 9, wherein the gas flow inlet tube is adapted to provide a first flow of gas into the upper region of the canister.

15. The apparatus of claim 14, wherein the gas flow inlet tube is adapted to provide a second flow of gas to the lower region of the canister.

16. The apparatus of claim 9, wherein the gas flow inlet tube comprises at least one opening anterior to the restriction.

17. The apparatus of claim 9, wherein the precursor material comprises pentakis(dimethylamido) tantalum having a chlorine concentration of about 5 ppm or less.

18. An apparatus for generating a precursor gas during a vapor deposition process, comprising:
   a canister containing an interior volume between a lid and a bottom;
   at least three silos coupled to the bottom and extending from a lower region to an upper region of the interior volume;
   a gas flow inlet tube coupled to a gaseous inlet and positioned to inject a carrier gas into the canister in a direction substantially away from the gaseous outlet; and
   a precursor comprising pentakis(dimethylamido) tantalum contained within the lower region of the canister.

19. The apparatus of claim 18, wherein each of the at least three silos comprise a thermal-conducting material.

20. The apparatus of claim 19, wherein the thermal-conducting material is selected from the group consisting of aluminum, stainless steel, and combinations thereof.

* * * * *

UNITED STATES PATENT AND TRADEMARK OFFICE
CERTIFICATE OF CORRECTION

Page 1 of 1

PATENT NO. : 8,062,422 B2
APPLICATION NO. : 12/371138
DATED : November 22, 2011
INVENTOR(S) : Chen et al.

It is certified that error appears in the above-identified patent and that said Letters Patent is hereby corrected as shown below:

In the Detailed Description of the Preferred Embodiment:

Column 9, Line 60, please insert --5-- before Torr.

Signed and Sealed this
Twenty-fourth Day of January, 2012

David J. Kappos
*Director of the United States Patent and Trademark Office*